United States Patent [19]
Chevallier

[11] Patent Number: 6,013,932
[45] Date of Patent: Jan. 11, 2000

[54] SUPPLY VOLTAGE REDUCTION CIRCUIT FOR INTEGRATED CIRCUIT

[75] Inventor: Christopher J. Chevallier, Palo Alto, Calif.

[73] Assignee: Micron Technology, Inc., Boise, Id.

[21] Appl. No.: 09/003,970

[22] Filed: Jan. 7, 1998

[51] Int. Cl.[7] .................................................. H01L 29/72
[52] U.S. Cl. ....................... 257/392; 257/314; 257/355; 257/371; 257/544; 327/143
[58] Field of Search .................................. 257/355, 392, 257/544, 371, 314; 327/143

[56] References Cited

U.S. PATENT DOCUMENTS 5,581,206  12/1996  Chevallier et al. ...................... 257/419
5,698,972  12/1997  Keeth ...................................... 323/349

*Primary Examiner*—Edward Wojciechowicz
*Attorney, Agent, or Firm*—Schwegman, Lundberg, Woessner & Kluth P.A.

[57] ABSTRACT

An integrated circuit device is described which includes a voltage reduction circuit to reduce an externally supplied voltage using a transistor threshold drop. The transistor is fabricated in a well to isolate the transistor from the integrated circuit substrate. The transistor can be fabricated with a lower breakdown voltage level and still reduce a high voltage. The transistor can also be fabricated in the same manner as other transistors in the integrated circuit. A voltage regulator circuit is also described which incorporates the reduction circuit to allow the use of transistors which are not designed to handle an external voltage Vpp.

21 Claims, 8 Drawing Sheets

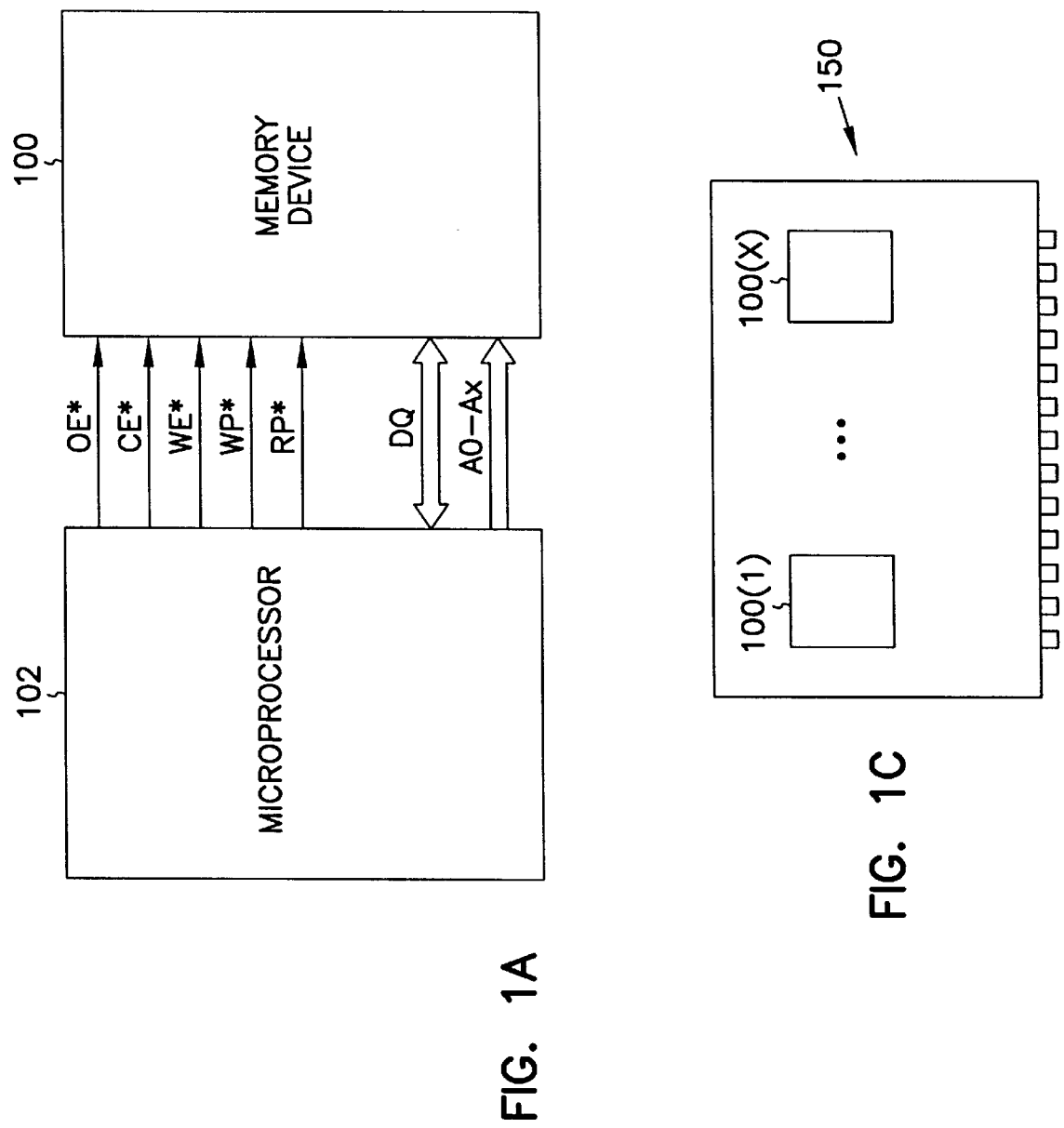

SUPPLY VOLTAGE REDUCTION CIRCUIT FOR INTEGRATED CIRCUIT

TECHNICAL FIELD OF THE INVENTION

The present invention relates generally to integrated circuits and in particular the present invention relates to a supply voltage reduction circuit.

BACKGROUND OF THE INVENTION

Most integrated circuits are designed to operate using a specific power supply voltage range. For example, a memory device may be designed to operate using a nominal 12 volt supply, and a range of ±5% or ±10%. If the integrated circuit were designed to use an internal voltage less than the supply voltage, the supply voltage is often regulated with internal circuitry to produce the lower voltage level. Certain integrated circuits have different externally supplied voltages for specific functions. For example, a FLASH memory device may receive an externally supplied voltage to program a floating gate memory cell.

The need for higher supply voltages is reduced as integrated circuit process technologies are developed to reduce the size of components, such as transistors. These components cannot handle the such high voltage levels without sustaining damage. For compatibility with prior devices, however, new integrated circuits should be capable of operating at the previous supply voltage levels. To reduce the supply voltage to a level which is desired, a transistor can be coupled to the supply voltage. The transistor, coupled as a diode, is designed to have a breakdown voltage which exceeds the supply voltage level. In an integrated circuit where the components are designed to handle lower voltages, additional process steps and masks are required to fabricate a transistor capable of handling a high voltage. That is, the transistor would require special process considerations, such as a thicker gate oxide and/or a larger gate and/or different source/drain implants.

For the reasons stated above, and for other reasons stated below which will become apparent to those skilled in the art upon reading and understanding the present specification, there is a need in the art for a voltage reduction circuit which allows a new generation of an integrated circuit to be compatible with voltage levels used in prior generations, while eliminating additional process steps.

SUMMARY OF THE INVENTION

The above mentioned problems with integrated circuits and other problems are addressed by the present invention and which will be understood by reading and studying the following specification. An integrated circuit is described which includes a simple voltage reduction circuit.

In particular, the present invention describes an integrated circuit comprising a substrate, a connection for receiving an externally supplied voltage having a first upper level, and a first input transistor having a drain and gate coupled to the connection for reducing the externally supplied voltage and providing an internal voltage having a second upper level at a source of the first input transistor. The first input transistor is fabricated in a first well structure to isolate the input transistor from the substrate such that the first input transistor has an operational breakdown voltage which is less than the first upper voltage level.

In another embodiment, an integrated circuit voltage reduction circuit comprises an n-well fabricated in an integrated circuit substrate. The n-well has bottom and side walls. The voltage reduction circuit includes a first n-channel transistor having a drain and gate coupled to an external connection for receiving an externally supplied voltage, and a second transistor coupled to the source of the first n-channel transistor. The first n-channel transistor is located within the n-well to isolate the first n-channel transistor from the substrate such that the first n-channel transistor has an operational breakdown voltage which is less than the externally supplied voltage level. The first n-channel transistor also reduces the externally supplied voltage by an n-channel threshold voltage to provide an internal voltage at a source of the first n-channel transistor.

In yet another embodiment, a flash memory device comprises an array of non-volatile memory cells, a connection for receiving an externally supplied signal having a first upper voltage level, a voltage reduction circuit having an input coupled to the connection for converting the externally supplied signal to an internal signal available at an output of the voltage reduction circuit, and an internal circuit coupled to the output of the voltage reduction circuit. The internal signal has a second upper voltage level which is lower than the first upper voltage level. The voltage reduction circuit comprises a first n-channel transistor having a drain and gate coupled to the input of the voltage reduction circuit. The first n-channel transistor is fabricated in an n-well structure and has a source coupled to the output of the voltage reduction circuit.

BRIEF DESCRIPTION OF THE DRAWINGS

FIG. 1A is a block diagram of a flash memory system;

FIG. 1C is a diagram of a memory card including several flash memories of FIG. 1B;

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

The present invention provides a voltage reduction circuit which uses a transistor to reduce an externally supplied voltage. This voltage can be a supply voltage, or a signal having a high upper voltage level. For simplicity, these are referred to generally herein as an externally supplied voltage. As known to one skilled in the art, an integrated circuit transistor is susceptible to source-to-drain breakdown, or punchthrough, drain-to-substrate breakdown, and breakdown of the gate oxide due to excessive fields across these terminals. The transistor in the voltage reduction circuitry is fabricated to reduce the voltage stress between the transistor source and drain regions, and the junction from drain to substrate. Thus, a transistor which has breakdown voltages in these regions that are less than the externally supplied voltage can be used.

One type of integrated circuit which is well suited to benefit from the voltage reduction circuit is an integrated memory device. The memory device can be any configuration, including but not limited to PROM, EPROM, EEPROM, and Flash EPROM. Prior to describing the voltage reduction circuit, a brief description is provided of a Flash memory which can incorporate the voltage reduction circuit.

Flash Memory

Figure 1B:
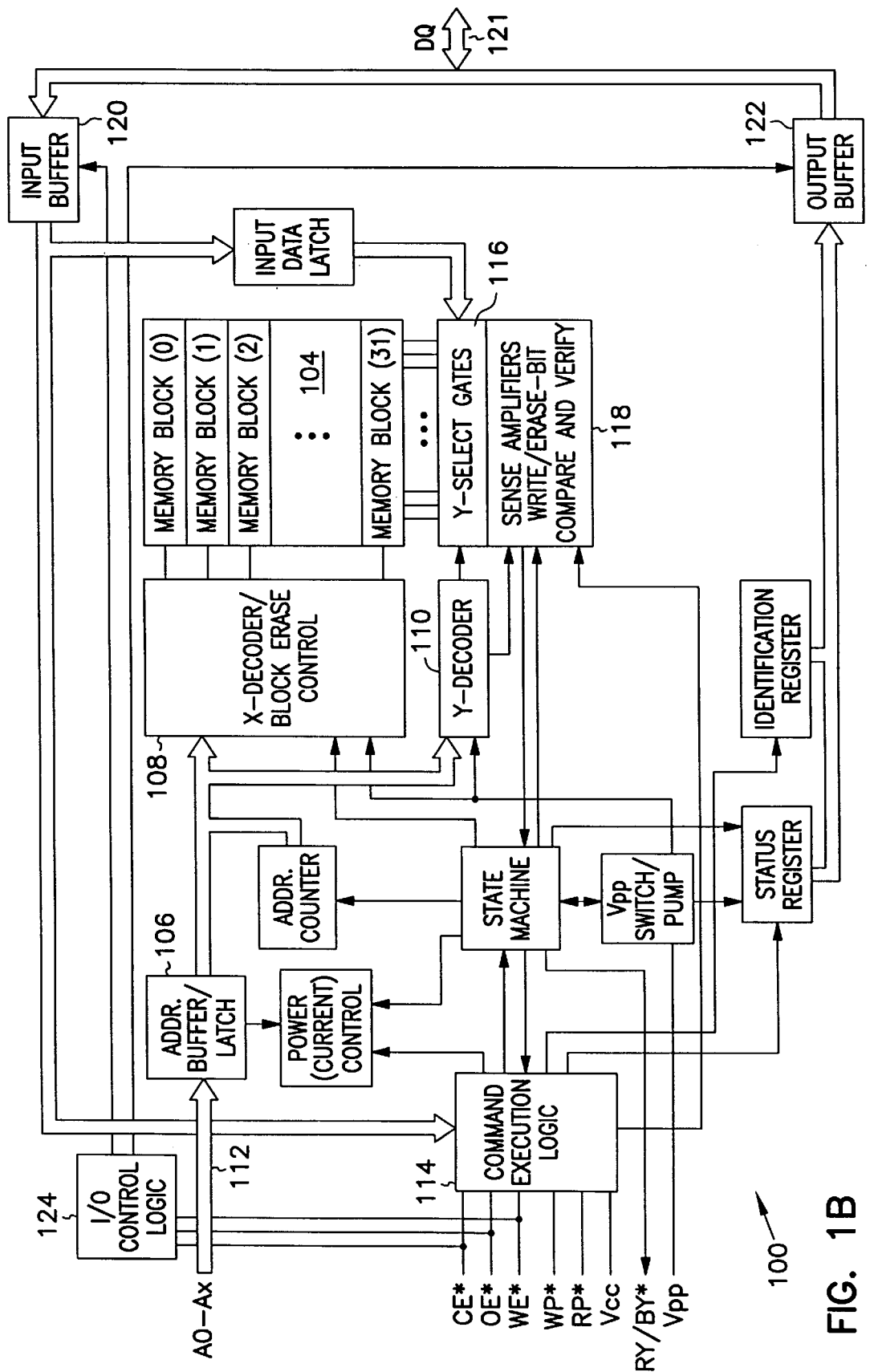
FIG. 1B is a detailed illustration of the flash memory of FIG. 1A.

FIG. 1A illustrates a block diagram of a basic Flash memory device 100 which is coupled to a microprocessor, or memory controller 102. The memory device has been simplified to focus on features of the memory which are helpful in understanding the present invention. The memory device 100 includes an array of non-volatile memory cells 104, FIG. 1B. The memory cells are preferably floating gate memory cells. The array is arranged in rows and columns, with the rows arranged in blocks. The blocks allow memory cells to be erased in blocks. Data, however, is stored in the memory array separate from the block structure. Erase operations, therefore, are performed much faster.

An x-decoder 108 and a y-decoder 110 are provided to decode address signals provided on address lines A0–Ax 112. An address buffer circuit 106 is provided to latch the address signals. Address signals are received and decoded to access the memory array 104. A y-select circuit 116 is provided to select a column of the array identified with the y-decoder 110. Sense amplifier and compare circuitry 118 is used to sense data stored in the memory cells and verify the accuracy of stored data. Data input 120 and output 122 buffer circuits are included for bi-directional data communication over a plurality of data (DQ) lines with the microprocessor 102. Command control circuit 114 decodes signals provided on control lines from the microprocessor. These signals are used to control the operations of the memory, including data read, data write, and erase operations. Input/output control circuit 124 is used to control the input and output buffers in response to some of the control signals. The memory includes an internal circuitry in command control circuit 114 for generating timing signals. As stated above, the Flash memory of FIG. 1A has been simplified to facilitate a basic understanding of the features of the memory. A more detailed understanding of Flash memories is known to those skilled in the art. See "1997 Flash Memory Data Book" pages 2–5 to 2–33 available from Micron Quantum Devices, Inc. (incorporated herein by reference) for a more detailed description of a Flash memory.

It will be appreciated that more than one Flash memory can be included in various package configurations. For example, compact Flash memory cards 150 can be manufactured in varying densities using numerous Flash memories 100(1)–100(x) as illustrated in FIG. 1C. See "1997 Flash Memory Data Book" pages 3–1 to 3–3 available from Micron Quantum Devices, Inc. (incorporated herein by reference) for a more detailed description of a Flash memory card.

Typical flash memories comprise a memory array having a large number of memory cells arranged in blocks. Each of the memory cells is fabricated as a field-effect transistor having a control gate and a floating gate. The floating gate is capable of holding a charge, and is separated, by a layer of thin oxide, from source and drain regions contained in a substrate. Each of the memory cells can be electrically programmed (charged) by injecting electrons from the drain region through the oxide layer onto the floating gate. The charge can be removed from the floating gate by tunneling the electrons to the source through the oxide layer during an erase operation. Thus, the data in a memory cell is determined by the presence or absence of a charge on the floating gate.

Flash memories have typical read operating voltages of about 5 volts or less. A high voltage, however, is usually required for programming and erase operations in a flash memory. This high voltage (Vpp) is typically in the range of 10 to 13 volts, but can be higher. During a programming operation, electrons are injected onto the floating gate by applying the high voltage (Vpp) to the control gate and about one-half Vpp to the drain region while the source region is grounded. Electron tunneling from the floating gate during an erase operation is accomplished by applying Vpp or less to the source region, connecting the control gate to ground potential and leaving the drain region electrically unconnected or floating.

Voltage Regulator Circuit

Figure 2A:
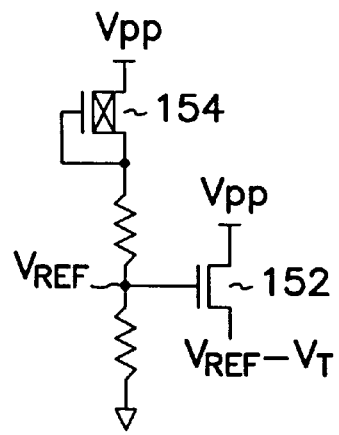
FIGS. 2A, 2B and 2C are schematic diagrams of voltage regulator circuits.
Figure 2B:
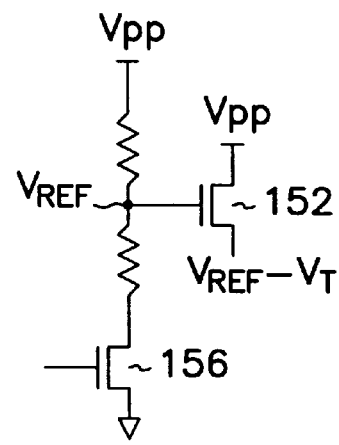
Figure 2C:
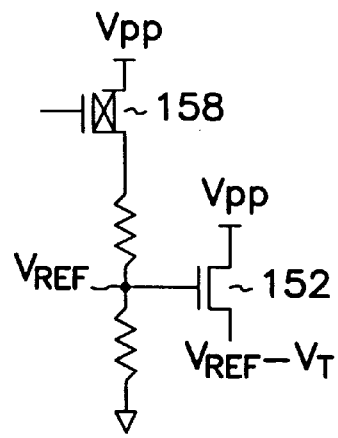

Referring to FIG. 2A, a voltage regulator circuit is illustrated which reduces an external voltage Vpp through transistor 152. The voltage is reduced to the gate voltage of transistor 152 less a threshold voltage of the transistor (Vref−Vt). The gate voltage is established by diode transistor 154 and the resistor divider circuit. This simple regulator reduces the external voltage and provides a constant voltage. While neither 154 nor 152 is subjected to fields as high as Vpp, however, a DC path through 154 and the resistors draws current, which may be undesirable. If the regulated voltage is desired to be turned on and off, a control switch 156 or 158, as shown respectively in FIGS. 2B and 2C, can be included in place of diode transistor 154. By deactivating a control switch, two potential problems are encountered. The first is a drain to substrate breakdown or a punch through from source to drain of the transistor control switch 156 or 158, or transistor 152. This is due to the large field experienced by the transistors and a relatively large Vpp level. The second problem is a breakdown of gate oxide of transistor 152 when its gate is coupled to a low voltage. To overcome these problems, these transistors could be fabricated to handle this large potential field. It is desired, however, to manufacture these transistors in the same manner as other transistors provided on the integrated circuit which have breakdown voltage characteristics that would not stand the external Vpp voltages. The present invention, as explained below, reduces the Vpp voltage through a transistor(s) isolated from the integrated circuit substrate by a well structure. This transistor configuration can be used prior to the switching transistor, and/or in place of transistor 152.

Voltage Reduction Circuit

Figure 3:
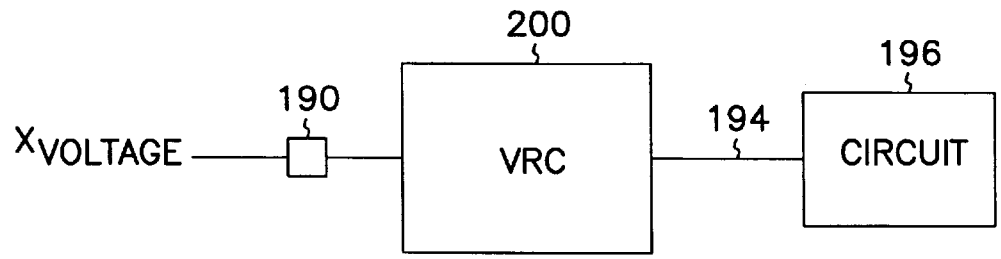
FIG. 3 is a block diagram of a voltage reduction circuit.

A voltage reduction circuit of the present invention is illustrated generally in FIG. 3. An external connection 190 is provided for receiving a voltage having an upper voltage level X. An input of voltage reduction circuit 200 is coupled to the connection 190. The voltage reduction circuit 200 reduces the voltage from X to a voltage level of X–Y at output 194. An internal circuit 196 is coupled to the voltage reduction circuit 200 for either further reducing the voltage below X–Y, or using the voltage for an internal operation such as writing or erasing flash memory.

Figure 4A:
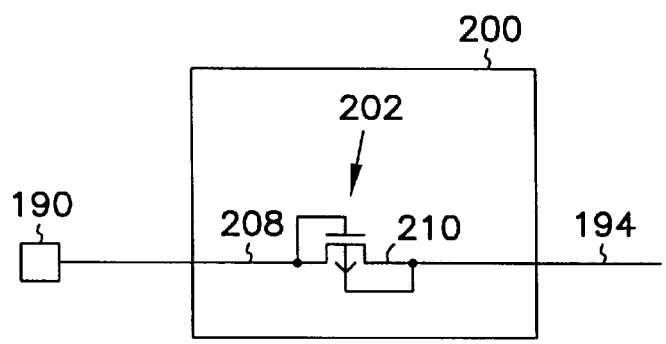
FIG. 4A is a more detailed diagram of one embodiment of a voltage reduction circuit.

Referring to FIG. 4A, a voltage reduction circuit 200 is described which is fabricated to reduce an externally supplied voltage while not requiring a special transistor breakdown specification. The circuit includes an n-channel input transistor 202 which is fabricated using an n-well to isolate the transistor from the integrated circuit substrate region. The externally supplied voltage is coupled to the drain and gate of transistor 202. The high voltage is reduced by a threshold voltage (Vt) as it passes through the transistor to output 194. Thus, an externally supplied voltage of level X is reduced to X–Vt.

Figure 4B:
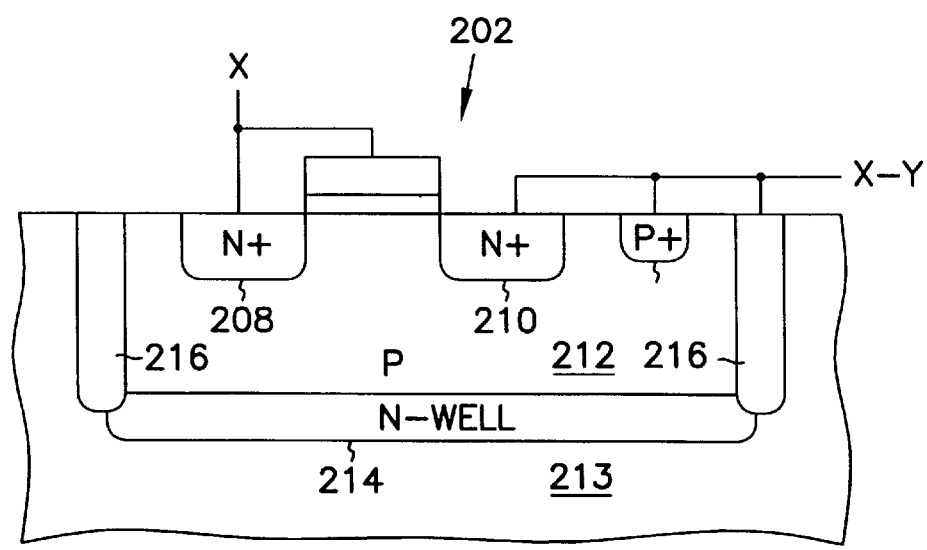
FIG. 4B is a cross-section view of the voltage reduction circuit of FIG. 4A.

FIG. 4B is a cross-section view of transistor 202 as fabricated and showing electrical connections for the drain, source and n-well. The drain 208 and source 210 are fabricated in a p-type region 212. The p-type region is isolated from the substrate 213 by a deep n-well 214 having n-type side walls 216. Region 212 and the n-well are coupled in this embodiment to the transistor source. As such, transistor 202 is only subjected to a junction stress of Vt, or approximately one volt.

Figure 5:
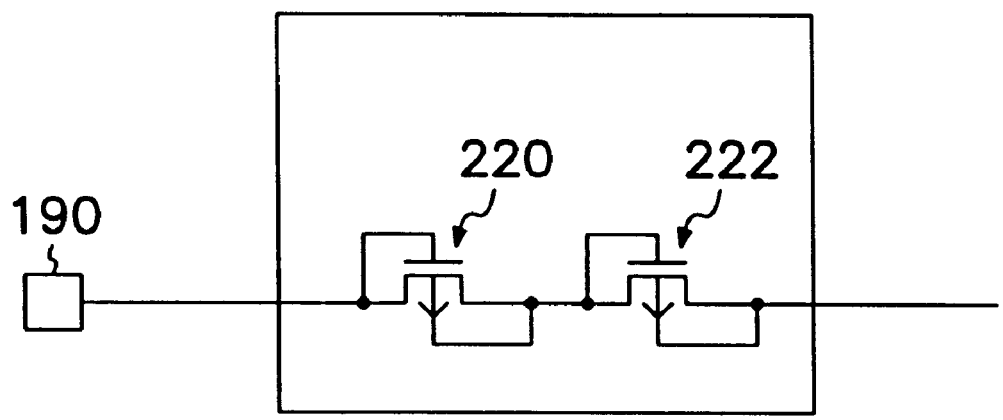
FIG. 5 is a more detailed diagram of another embodiment of a voltage reduction circuit.
Figure 6:
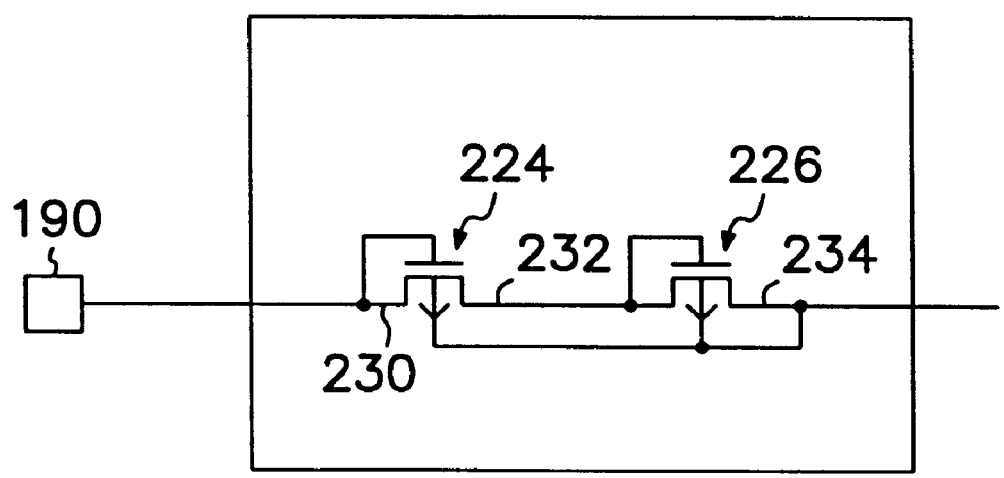
FIG. 6 is a more detailed diagram of another embodiment of a voltage reduction circuit.

FIGS. 5 and 6 illustrate alternate embodiments of the voltage reduction circuit. The circuit of FIG. 5 uses two series coupled transistors 220 and 222 each formed in a separate well structure. Thus, two deep n-wells are used to reduce the external voltage by two threshold voltages (2Vt). The input voltage X, therefore, is reduced to X–2Vt. Where X, X–Vt, and X–2Vt are 12, 11, and 10, respectively, in one embodiment. Each transistor 220 and 222 can be fabricated as illustrated in FIG. 4.

Figure 7:
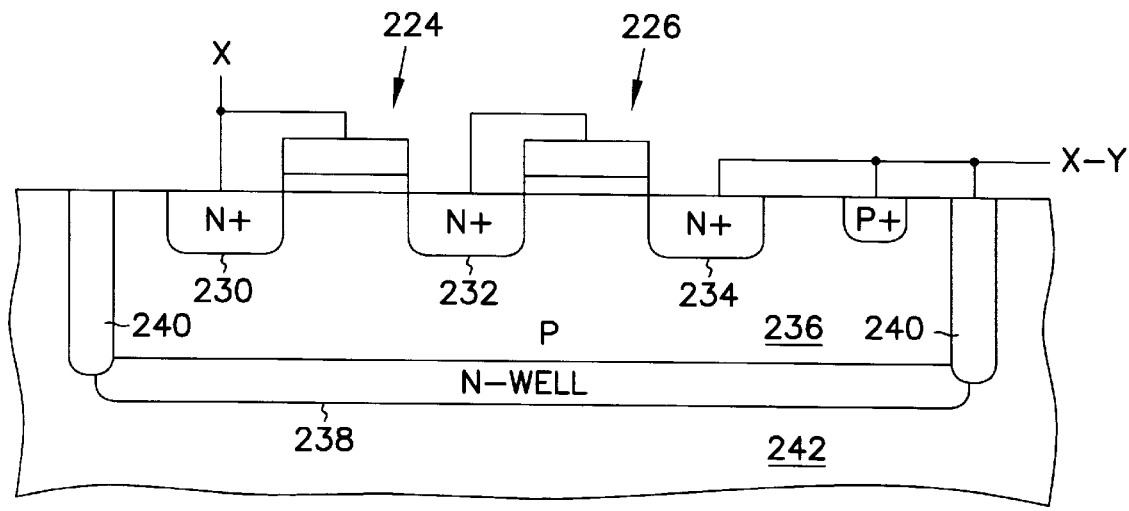
FIG. 7 is a cross-section view of the voltage reduction circuit of FIG. 6.

FIG. 6 illustrates an alternate embodiment of the voltage reduction circuit 200 having two transistors 224 and 226 fabricated in one well structure. Thus, two transistors and one deep n-well are used to reduce the external voltage by two threshold voltages (2Vt). A cross-section of these transistors is illustrated in FIG. 7 and shows electrical connections for the drains, sources and n-well. The drain 230 and source 232 of transistor 224 are fabricated in a p-type region 236. Likewise the drain 232 and source 234 of transistor 226 are fabricated in a p-type region 236. The p-type region is isolated from the substrate 242 by a deep n-well 238 having n-type side walls 240. Region 236 and the n-well are coupled in this embodiment to the source 234 of transistor 226. As such, transistors 224 and 226 are only subjected to a maximum junction stress of approximately two volts. That is, a junction stress of a Vto (no back bias) plus a Vt with a back bias of Vto is experienced. For example, a Vto of 1 volt and a Vt of 1.2 volts results in a junction stress and voltage reduction of 2.2 volts.

Figure 8:
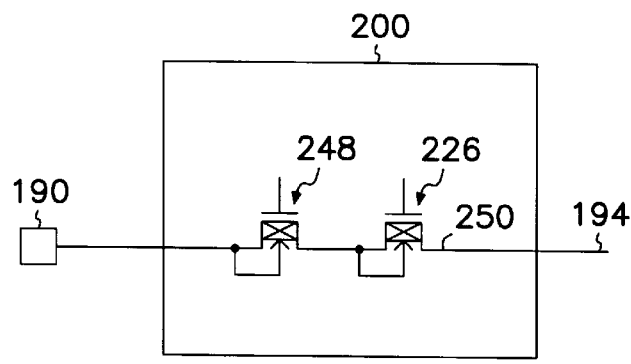
FIG. 8 is a more detailed illustration of internal circuitry of FIG. 3.

FIG. 8 illustrates an alternate embodiment of circuitry 200. The circuit can include p-channel series connected transistors 248 fabricated in an n-well. The transistors are coupled between node 190 and output 194 to reduce Vpp. This embodiment is available when a large current does not need to be driven by the transistor. That is, the n-channel transistor has better conductance, but requires an additional well structure.

Voltage Regulation Circuit with Reduction Circuit

Figure 9:
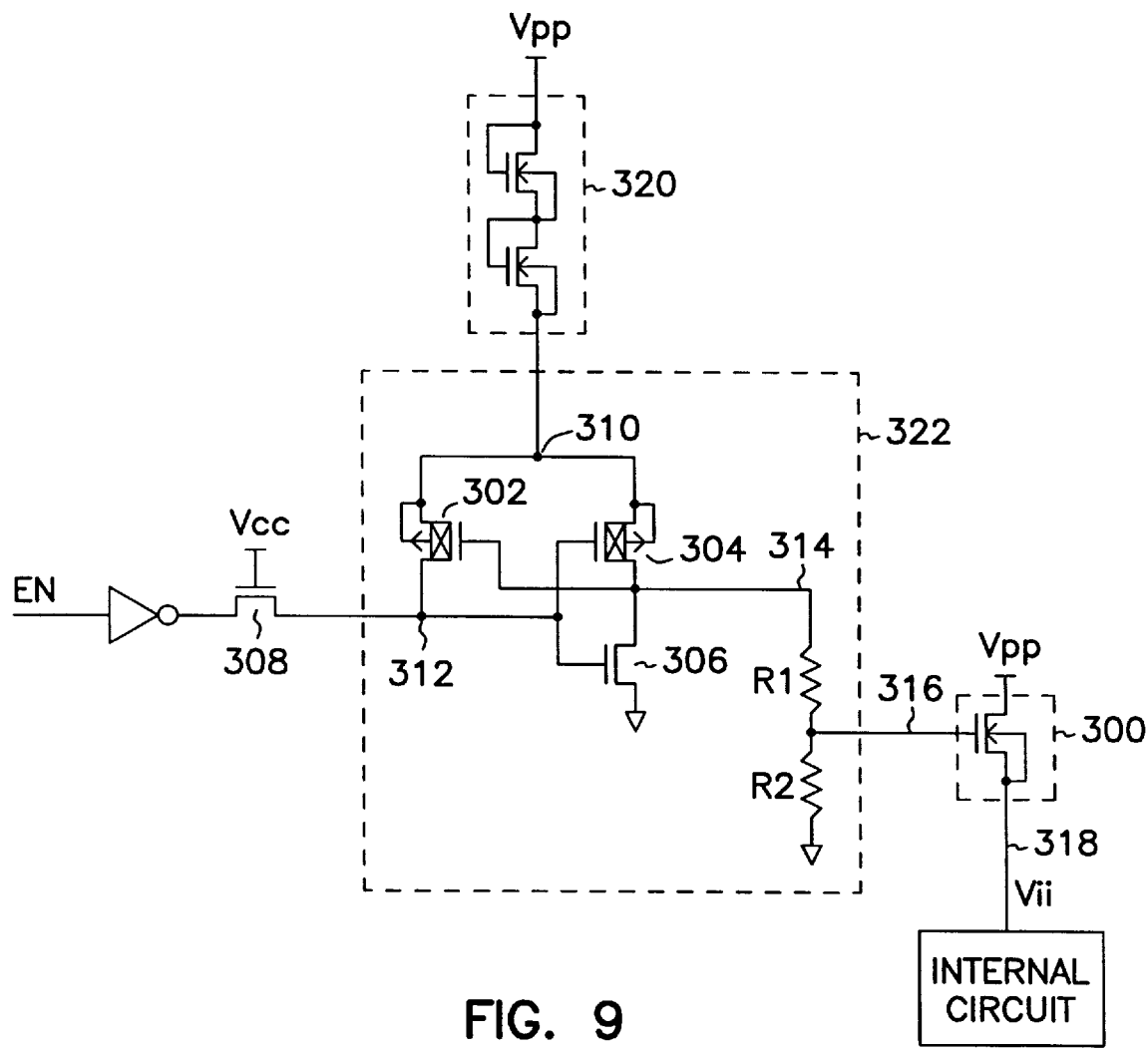
FIG. 9 is one embodiment of a voltage regulation circuit including voltage reduction circuitry.

FIG. 9 is one embodiment of a voltage regulation circuit including voltage reduction circuitry described above. The regulator includes two voltage reduction circuits 300 and 320. The first reduction circuit 300 is used to provide a regulated internal voltage Vii at node 318 to any internal circuit. The second reduction circuit 320 is used to reduce Vpp for switching circuitry 322. This circuit is best understood by studying its operation. An enable signal (EN) is provided to control circuit 322. When EN is a high logic level (1), node 312 is at a logic low level which activates transistor 304. Transistor 304 then couples node 310 to the gate of transistor 316 through resistor R1. The voltage on the gate of transistor 300 is established by the resistor divider circuit of R1 and R2 and voltage reduction circuit 320. The voltage on node 310 is reduced by circuit 320 to Vpp–2Vt. Transistor 300 is activated to provide a voltage on node 318 which is reduced from Vpp.

Figure 10:
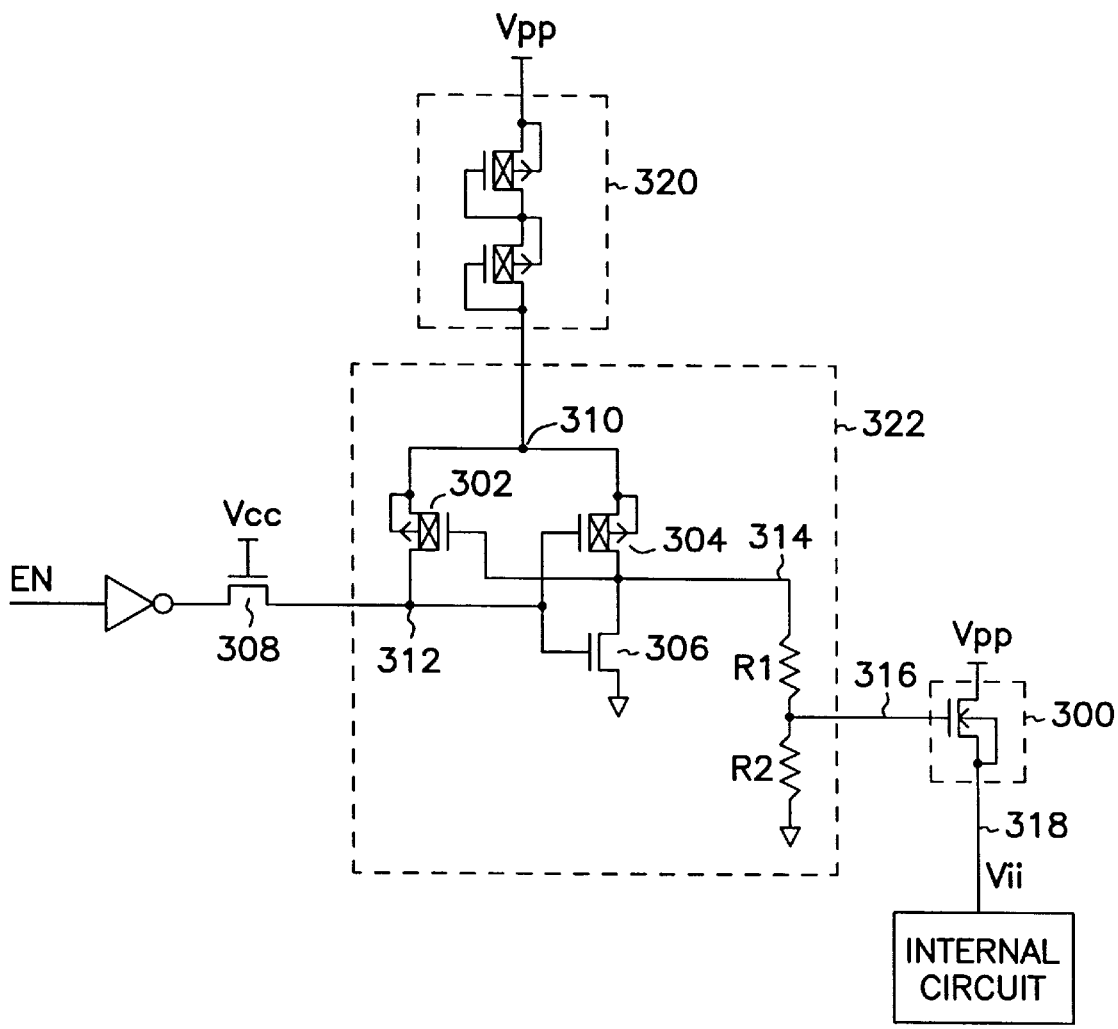
FIG. 10 is a second embodiment of a voltage regulation circuit including voltage reduction circuitry.

When the EN signal is at a low logic level (0), transistor 304 is turned off and transistor 306 is activated. Likewise, transistor 302 is activated and pulls node 312 to the potential of node 310. Node 316, therefore, is pulled low through transistor 306. Transistor 300 is off such that node 318 is free to be coupled to a voltage level such as Vcc, or can be left electrically floating. Table 1 summarizes the voltages during operation of the circuit of FIG. 9. FIG. 10 illustrates the circuit of FIG. 9, but uses p-channel transistors in the reduction circuit 320.

TABLE 1

| EN | NODE 312 | NODE 314 | NODE 310 | NODE 316 | NODE 318 |
|---|---|---|---|---|---|
| 1 | 0 | Vpp – 2Vt | Vpp – 2Vt | on | $V_{316}$ – Vt |
| 0 | Vpp – 2Vt | 0 | Vpp – 2Vt | 0 | off |

If internal circuitry coupled to node 318 is turned off, the subthreshold and diode leakage of the internal circuitry will maintain transistor 300 in a biased state with a source to gate drop of a Vt. During power-up or at other times, it is possible that the Vpp supply will be at zero while Vcc is active. A detector circuit can be provided to disable any circuit using Vpp. If the Vpp supply goes to zero, any charge left on internal nodes will discharge through the p-well into the drain of the n-channel transistor 300, or an equivalent well to drain junction for a p-channel transistor.

In the embodiment of FIGS. 9 and 10, no transistor is submitted to drain to source fields of the order of Vpp. During the off mode (EN=0), transistor 300 will have Vpp between its gate and drain. The transistors are protected from punch-through, therefore, but not from oxide breakdown. A further enhancement would comprise using a low voltage supply V1 (one or two volts, up to Vcc) instead of the ground connections at 306 and R2. In the off mode, transistor 300 would have Vpp–V1 across its oxide.

Conclusion

An integrated circuit device has been described which includes a voltage reduction circuit to reduce an externally supplied voltage using a transistor threshold drop(s). The transistor is fabricated in a well to isolate the transistor from the substrate. The transistor, therefore, can be fabricated with a lower breakdown voltage level and still reduce a high voltage. The transistor can be fabricated in the same manner as other transistors in the integrated circuit. In addition, a voltage regulator circuit has been described which incorporated the reduction circuit to allow the use of transistors which are not designed to handle an external voltage Vpp.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit comprising:
    a substrate;
    a connection for receiving an externally supplied voltage having a first upper level; and
    a first input transistor having a drain and gate coupled to the connection for reducing the externally supplied voltage and providing an internal voltage having a second upper level at a source of the first input transistor, the first input transistor being fabricated in a first well structure to isolate the input transistor from the substrate such that the first input transistor has an operational breakdown voltage which is less than the first upper voltage level.

2. The integrated circuit of claim 1 wherein the first input transistor is an n-channel transistor fabricated in an isolated p-well.

3. The integrated circuit of claim 1 further comprising:
    at least one additional transistor coupled to the source of the first input transistor to further reduce the internal voltage to a third upper level.

4. The integrated circuit of claim 1 further comprising:
    a second input transistor having a drain and gate coupled to the source of the first input transistor for reducing the internal voltage to a third upper level at a source of the second input transistor, the second input transistor being fabricated in a second well structure.

5. The integrated circuit of claim 1 further comprising:
    a second input transistor having a drain and gate coupled to the source of the first input transistor for reducing the internal voltage to a third upper level at a source of the second input transistor, the second input transistor being fabricated in the first well structure.

6. An integrated circuit voltage reduction circuit comprising:
    an n-well fabricated in an integrated circuit substrate, the n-well having a bottom and side walls;
    a p-well fabricated in the n-well;
    a first n-channel transistor having a drain and gate coupled to an external connection for receiving an externally supplied voltage, the first n-channel transistor located within the p-well to isolate the first n-channel transistor from the substrate such that the first n-channel transistor has an operational breakdown voltage which is less than the externally supplied voltage level, the first n-channel transistor reduces the externally supplied voltage by an n-channel threshold voltage to provide an internal voltage at a source of the first n-channel transistor; and
    a second device coupled to the source of the first n-channel transistor.

7. The integrated circuit voltage reduction circuit of claim 6 wherein the second device is a transistor is an n-channel transistor fabricated in a second p-well.

8. The integrated circuit voltage reduction circuit of claim 6 wherein the second device is an n-channel transistor fabricated in the p-well.

9. The integrated circuit voltage reduction circuit of claim 6 wherein the second device is a p-channel transistor.

10. A flash memory device comprising:
    an array of non-volatile memory cells;
    a connection for receiving an externally supplied signal having a first upper voltage level;
    a voltage reduction circuit having an input coupled to the connection for converting the externally supplied signal to an internal signal available at an output of the voltage reduction circuit, the internal signal having an second upper voltage level which is lower than the a first upper voltage level;
    the voltage reduction circuit comprising a first n-channel transistor having a drain and gate coupled to the input of the voltage reduction circuit, the first n-channel transistor is fabricated in an isolated p-well structure and has a source coupled to the output of the voltage reduction circuit; and
    an internal circuit coupled to the output of the voltage reduction circuit.

11. Th e flash memory device of claim 10 wherein the voltage reduction circuit further comprises a second n-channel transistor coupled in series with the first n-channel transistor and fabricated in the isolated p-well structure.

12. The flash memory device of claim 10 wherein the voltage reduction circuit further comprises a second n-channel transistor coupled in series with the first n-channel transistor and fabricated in a second isolated p-well structure.

13. The flash memory device of claim 10 wherein the internal circuit is a flash memory write circuit for coupling the externally supplied signal to the array of non-volatile memory cells for performing a write operation.

14. The flash memory device of claim 10 wherein the internal circuit is a flash memory erase circuit for coupling the externally supplied signal to the array of non-volatile memory cells for performing a erase operation.

15. A processing system comprising:
    a controller coupled to a memory device for bidirectional data communication; and
    the memory device comprising,
        a substrate;
        a connection for receiving an externally supplied voltage having a first upper level; and
        a first input transistor having a drain and gate coupled to the connection for reducing the externally supplied voltage and providing an internal voltage having a second upper level at a source of the first input transistor, the first input transistor being fabricated in a first well structure to isolate the input transistor from the substrate such that the first input transistor has an operational breakdown voltage which is less than the first upper voltage level.

16. The processing system of claim 15 wherein the first input transistor is an n-channel transistor fabricated in an isolated p-well.

17. A voltage regulator circuit comprising:
    a connection for receiving an externally supplied voltage having a first upper level;

a first voltage reduction circuit comprising a first diode coupled transistor coupled to receive the externally supplied voltage from the connection for reducing the externally supplied voltage and providing a first internal voltage having a second upper level;

a second voltage reduction circuit comprising a second transistor coupled to receive the externally supplied voltage from the connection for receiving the externally supplied voltage and providing a second internal voltage at a source of the second transistor;

a switching circuit coupled to the first and second voltage reduction circuits, the switching circuit couples a gate of the second transistor to the first internal voltage in response to a first enable signal state, and couples the gate of the second transistor to a deactivation voltage in response to a second enable signal state.

18. The voltage regulator circuit of claim 17 wherein the first diode coupled transistor is an n-channel transistor fabricated in an isolated p-well.

19. The voltage regulator circuit of claim 17 wherein the first diode coupled transistor is a p-channel transistor fabricated in an isolated n-well.

20. The voltage regulator circuit of claim 17 wherein the first voltage reduction circuit further comprises a third transistor coupled as a diode.

21. The voltage regulator circuit of claim 17 wherein the second transistor is an n-channel transistor fabricated in an isolated p-well.

* * * * *

UNITED STATES PATENT AND TRADEMARK OFFICE
CERTIFICATE OF CORRECTION

PATENT NO.: 6,013,932

DATED: Jan. 11, 2000

INVENTOR(S): Chevallier

It is certified that error appears in the above-identified patent and that said Letters Patent is hereby corrected as shown below:

Title page, item [75],
In the first name of the inventor, delete "Christopher" and insert --Christophe--, therefore.

In column 8, line 29, delete "Th e flash" and insert --The flash--, therefore.

Signed and Sealed this

Twentieth Day of March, 2001

*Attest:*

NICHOLAS P. GODICI

*Attesting Officer*     *Acting Director of the United States Patent and Trademark Office*